(12) United States Patent
Washio et al.

(10) Patent No.: US 10,889,893 B2
(45) Date of Patent: Jan. 12, 2021

(54) ATOMIC LAYER DEPOSITION APPARATUS AND ATOMIC LAYER DEPOSITION METHOD

(71) Applicant: THE JAPAN STEEL WORKS, LTD., Tokyo (JP)

(72) Inventors: Keisuke Washio, Kanagawa (JP); Tatsuya Matsumoto, Kanagawa (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 28 days.

(21) Appl. No.: 16/328,269

(22) PCT Filed: Apr. 24, 2017

(86) PCT No.: PCT/JP2017/016188
§ 371 (c)(1),
(2) Date: Feb. 25, 2019

(87) PCT Pub. No.: WO2018/042755
PCT Pub. Date: Mar. 8, 2018

(65) Prior Publication Data
US 2019/0211448 A1 Jul. 11, 2019

(30) Foreign Application Priority Data
Aug. 31, 2016 (JP) .................. 2016-168993

(51) Int. Cl.
*C23C 16/44* (2006.01)
*H01L 21/67* (2006.01)
(Continued)

(52) U.S. Cl.
CPC ........ *C23C 16/45544* (2013.01); *C23C 16/44* (2013.01); *C23C 16/45527* (2013.01);
(Continued)

(58) Field of Classification Search
CPC .............. C23C 16/45544; C23C 16/44; C23C 16/45527; C23C 16/4401;
(Continued)

(56) References Cited

U.S. PATENT DOCUMENTS

| 5,891,348 A | 4/1999 | Ye et al. |
| 9,175,377 B2 | 11/2015 | Ishihara |

(Continued)

FOREIGN PATENT DOCUMENTS

| CN | 102148125 A | 8/2011 |
| JP | H09-232294 A | 9/1997 |

(Continued)

OTHER PUBLICATIONS

International Search Report from International Patent Application No. PCT/JP2017/016188, dated Jul. 11, 2017.
(Continued)

*Primary Examiner* — Kyoung Lee
(74) *Attorney, Agent, or Firm* — SGPatents PLLC

(57) ABSTRACT

An atomic layer deposition apparatus includes: a film-forming container 11 in which a film-forming process is performed; a vertically movable stage 14 provided in the film-forming container 11 and being configured to hold a substrate 100; a stage stopper 17 configured to stop rising of the stage 14 and, when in contact with the stage 14, partitioning a film-forming space S in which the film-forming process is performed and a transporting space in which transport of the substrate 100 is performed; a peripheral stage deposition prevention member 15 covering a peripheral portion of the stage 14; and a stage stopper deposition prevention member 24 provided on the stage stopper 17.

19 Claims, 8 Drawing Sheets

(51) Int. Cl.
*C23C 16/455* (2006.01)
*H01L 21/687* (2006.01)
*H01L 51/50* (2006.01)
*H01L 21/02* (2006.01)

(52) U.S. Cl.
CPC .... *H01L 21/0228* (2013.01); *H01L 21/02178* (2013.01); *H01L 21/6719* (2013.01); *H01L 21/68735* (2013.01); *H01L 21/68757* (2013.01); *H01L 21/68785* (2013.01); *H01L 51/50* (2013.01)

(58) Field of Classification Search
CPC ......... H01L 21/68757; H01L 21/68735; H01L 51/50; H01L 21/68785; H01L 21/6719; H01L 21/02178; H01L 21/0228
See application file for complete search history.

(56) References Cited

U.S. PATENT DOCUMENTS

| | | | |
|---|---|---|---|
| 2005/0110115 A1* | 5/2005 | Kil | H01L 21/02178 257/532 |
| 2006/0280868 A1 | 12/2006 | Kato et al. | |
| 2009/0156015 A1 | 6/2009 | Park et al. | |
| 2009/0250008 A1 | 10/2009 | Matsushima et al. | |
| 2012/0031748 A1 | 2/2012 | Ishihara | |
| 2016/0010210 A1 | 1/2016 | Yanai | |
| 2016/0024650 A1 | 1/2016 | Toyoda et al. | |
| 2016/0319422 A1 | 11/2016 | Kurita et al. | |
| 2019/0177842 A1* | 6/2019 | Washio | C23C 16/458 |

FOREIGN PATENT DOCUMENTS

| | | |
|---|---|---|
| JP | H11-340208 A | 12/1999 |
| JP | 2001-316797 A | 11/2001 |
| JP | 2006-351655 A | 12/2006 |
| JP | 2007-027490 A | 2/2007 |
| JP | 2009-062579 A | 3/2009 |
| JP | 2009-088232 A | 4/2009 |
| JP | 2009-203488 A | 9/2009 |
| JP | 2011-124362 A | 6/2011 |
| JP | 2012-052221 A | 3/2012 |
| JP | 2014-133927 A | 7/2014 |
| JP | 2015-203145 A | 11/2015 |
| JP | 2016-018886 A | 2/2016 |
| JP | 2016-025238 A | 2/2016 |
| JP | 2016-111291 A | 6/2016 |
| TW | 200932945 A | 8/2009 |
| WO | WO 2015/112470 A1 | 7/2015 |
| WO | WO 2016/190005 A1 | 12/2016 |

OTHER PUBLICATIONS

Office Action dated Mar. 3, 2020, in Japanese Patent Application No. 2016-168993.
Office Action dated Apr. 20, 2020, in Chinese Patent Application No. 201780035105.2.

* cited by examiner

ATOMIC LAYER DEPOSITION APPARATUS AND ATOMIC LAYER DEPOSITION METHOD

TECHNICAL FIELD

The present invention relates to an atomic layer deposition apparatus and an atomic layer deposition method in which a thin film is formed over, for example, a substrate.

BACKGROUND ART

The atomic layer deposition technique is a technique in which a thin film is formed in a unit of atomic layer over a substrate by alternately supplying gas of an element configuring the thin film to be formed onto the substrate, and is known as a technique for uniformly forming a thin film. In addition, the atomic layer deposition method has advantages such as excellent step coverage and excellent film thickness controllability as compared to the CVD (Chemical-Vapor-Deposition) method.

When a process of forming a thin film is repeatedly performed by the atomic layer deposition method, a thin film is also adhered to an inner wall of a film-forming container. Further, when the thin film adhered to the inner wall of the film-forming container becomes thick, the deposited thin film peels off and a portion thereof becomes particles. Therefore, it is necessary to periodically remove the thin film adhered to the inner wall of the film-forming container.

For example, Japanese Patent Application Laid-Open Publication No. 2006-351655 (Patent Document 1) discloses a processing method and a chemical vapor deposition apparatus which use a deposition prevention plate and in which deposition materials deposited on an inner wall of a chamber are covered by an amorphous film.

In addition, for example, Japanese Patent Application Laid-Open Publication No. 2009-62579 (Patent Document 2) discloses a technique in which a deposition prevention plate is inserted into a film-forming container such that a period of the wet etching process is increased.

Further, for example, Japanese Patent Application Laid-Open Publication No. 2012-52221 (Patent Document 3) discloses a technique in which a deposition prevention plate is provided and inert gas is supplied such that film deposition is suppressed.

Furthermore, for example, Japanese Patent Application Laid-Open Publication No. 2001-316797 (Patent Document 4) discloses a technique in which a deposition prevention member is attached to a substrate carrier of a film-forming apparatus such that adhesion of a film onto a surface of the substrate carrier is prevented.

In addition, for example, Japanese Patent Application Laid-Open Publication No. 2014-133927 (Patent Document 5) discloses a technique in which a deposition prevention plate is provided in a processing chamber of a plasma processing apparatus such that adhesion of an insulating member to regions other than on a substrate is prevented.

RELATED ART DOCUMENTS

Patent Documents

Patent Document 1: Japanese Patent Application Laid-Open Publication No. 2006-351655
Patent Document 2: Japanese Patent Application Laid-Open Publication No. 2009-62579
Patent Document 3: Japanese Patent Application Laid-Open Publication No. 2012-52221
Patent Document 4: Japanese Patent Application Laid-Open Publication No. 2001-316797
Patent Document 5: Japanese Patent Application Laid-Open Publication No. 2014-133927

SUMMARY OF THE INVENTION

Problems to be Solved by the Invention

In the film-forming process by the atomic layer deposition method, source gas (such as TMA: Tri-Methyl-Aluminum) used is easily diffused and thus easily enters a small gap in the film-forming container, thereby forming a film. For example, in an atomic layer deposition apparatus in which a film-forming chamber and a transporting chamber are partitioned by a stage stopper and a stage, a gap is formed in the partitioned part which is likely to become a point where particles are generated. That is, the source gas having entered such a small gap becomes a film and powders which cause generation of particles.

Particularly, in a large area type atomic layer deposition apparatus configured to accommodate a large glass substrate, the stage becomes larger as the substrate becomes larger, whereby a flatness of the stage would decrease as the stage becomes larger. As a result, a size of the gap in the partitioned part increases, and generation of particles becomes more conspicuous.

Other problems and novel features will be apparent from the description of the present specification and the attached drawings.

Means for Solving the Problems

An atomic layer deposition apparatus according to one embodiment includes: a film-forming container in which a film-forming process is performed on a substrate; a vertically movable stage provided in the film-forming container and being configured to hold the substrate; and a stage stopper configured to stop rising of the stage and, when in contact with the stage, partitioning a film-forming space in which the film-forming process is performed and a transporting space in which transport of the substrate is performed. The atomic layer deposition apparatus further includes a first stage deposition prevention member covering a peripheral portion of the stage, and a stage stopper deposition prevention member provided on the stage stopper.

In addition, an atomic layer deposition method according to one embodiment includes the steps of: (a) mounting a substrate on a stage; (b) after the step (a), introducing source gas from a gas inlet provided in the film-forming container into the film-forming container such that the source gas is absorbed onto the substrate; and (c) after the step (b), introducing purge gas from the gas inlet into the film-forming container such that the source gas is discharged outside the film-forming container. The atomic layer deposition method further includes the steps of: (d) after the step (c), introducing reaction gas from the gas inlet into the film-forming container such that the reaction gas is supplied onto the substrate and a desired thin film is formed over a surface of the substrate; and (e) after the step (d), introducing purge gas from the gas inlet into the film-forming container such that the reaction gas is discharged outside the film-forming container, wherein, during the steps (b) to (e), inert gas is flowed in the film-forming container.

Effects of the Invention

According to the above-described embodiment, it is possible to suppress generation of particles in the film-forming container and improve film quality of the thin film formed over the substrate.

DETAILED DESCRIPTION OF PREFERRED EMBODIMENTS

<Configuration of Atomic Layer Deposition Apparatus>

A configuration of an atomic layer deposition apparatus 10 of the present embodiment will be described with reference to FIG. 1.

Figure 1:
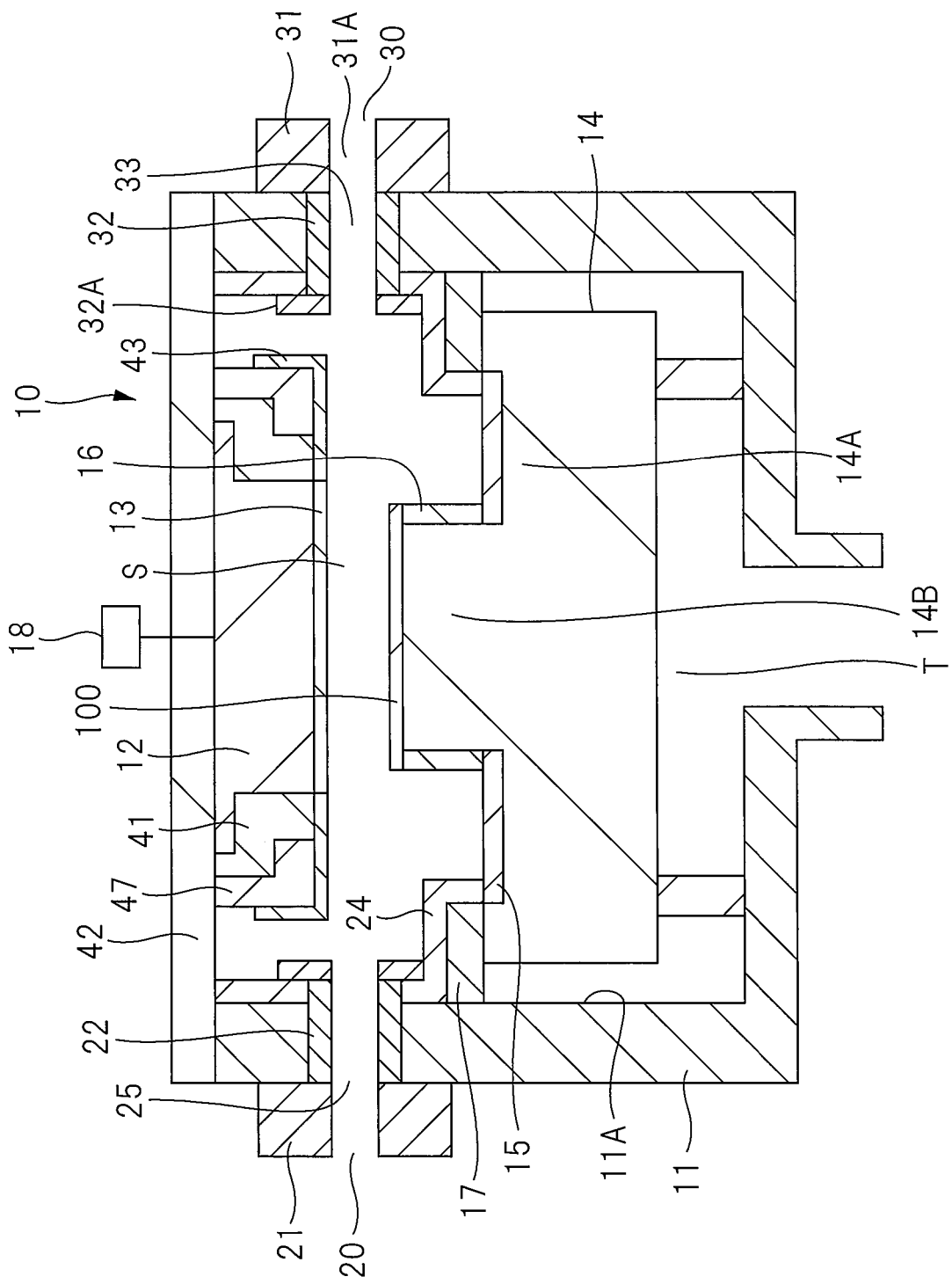
FIG. 1 is a drawing of a schematic configuration showing an example of a structure of an atomic layer deposition apparatus of an embodiment.

FIG. 1 is a drawing of a schematic configuration showing an example of a structure of the atomic layer deposition apparatus of the present embodiment.

The atomic layer deposition apparatus 10 of the present embodiment is configured to form a thin film in a unit of atomic layer over a substrate 100 by alternately supplying source gas and reaction gas onto the substrate 100. At this time, the substrate 100 can be heated in order to enhance reaction activity. In the present embodiment, TMA (Tri-Methyl-Aluminum) is used as an example of the source gas, and plasma is generated during a film-forming process in order to enhance the reaction activity. A parallel plate electrode is used to generate plasma in the present embodiment; however, the method to generate plasma is not limited thereto.

A film-forming container (also referred to as a chamber) 11 provided in the atomic layer deposition apparatus 10 is a container in which the film-forming process is performed on the substrate 100, and comprises injector 21, an outlet flange 31, a plate electrode 12, a stage 14 serving as a counter electrode and being configured to hold the substrate 100, and a high-frequency power supply 18.

The plate electrode 12 is arranged so as to face the stage 14, is provided above the substrate 100 with a film-forming space S formed therebetween, and is supported by an insulating support 41 arranged on a side of the plate electrode 12. The insulating support 41 is supported by a top-plate supporting portion 47. Further, an upper insulating deposition prevention member 43 covering the top-plate supporting portion 47 and the insulating support 41 is provided on a peripheral portion of the top-plate supporting portion 47 configured to hold the insulating support 41.

In addition, an end portion of a surface of the plate electrode 12 exposed in a direction of the stage 14 corresponds to an end portion of the plate electrode 12, and a conductive plate electrode deposition prevention member 13 is provided on the plate electrode 12 exposed on a lower surface side.

The stage 14 is configured to hold the substrate 100 and comprises a heater such that a temperature of the substrate 100 can be adjusted to a desired temperature. For example, in a case of an atomic layer deposition process, the substrate 100 is heated to 50° C. to 200° C. At the time of the film-forming process, the film-forming container 11 is maintained in a vacuum state. Further, the high-frequency power supply 18 supplies a high-frequency current at a predetermined frequency to the plate electrode 12, whereby plasma is generated between the plate electrode 12 and the stage 14.

In addition, the stage 14 comprises a vertically movable mechanism, and at the time of the film-forming process, processing is performed when the stage 14 is at the highest elevated position. Further, a conductive susceptor may be provided on the stage 14. In this case, the substrate 100 is held on the susceptor, and the high-frequency power supply 18 supplies a high-frequency current at a predetermined frequency to the plate electrode 12, whereby plasma is generated between the plate electrode 12 and the susceptor.

Next, a gas inlet 20 to which the source gas, reaction gas and purge gas are introduced will be described. The gas inlet 20 allows the source gas, reaction gas and purge gas to be supplied into the film-forming container 11 in accordance with the process. In addition, the injector 21 is attached to a gas inlet side opening 25 of the film-forming container 11, and an injector deposition prevention member 22 is inserted into the gas inlet side opening 25 from inside the film-forming container 11 and is attached so as to surround the gas inlet side opening 25.

Next, an outlet 30 will be described. The outlet 30 allows the source gas, reaction gas and purge gas to be exhausted from the film-forming container 11 in accordance with the process. The outlet flange 31 is attached to a gas outlet side opening 33 of the film-forming container 11, and an outlet deposition prevention member 32 is inserted into the gas outlet side opening 33 from inside the film-forming container 11 and is attached so as to surround the gas outlet side opening 33. Further, the gas introduced into the film-forming container 11 causes a gas flow from the gas inlet 20 toward the outlet 30 in accordance with the process. Hereinafter, a direction along a direction of the gas flow will be described as a side direction.

Next, detailed structures of the stage 14 and a periphery of the stage 14 will be described with reference to FIGS. 2 to 4.

Figure 2:
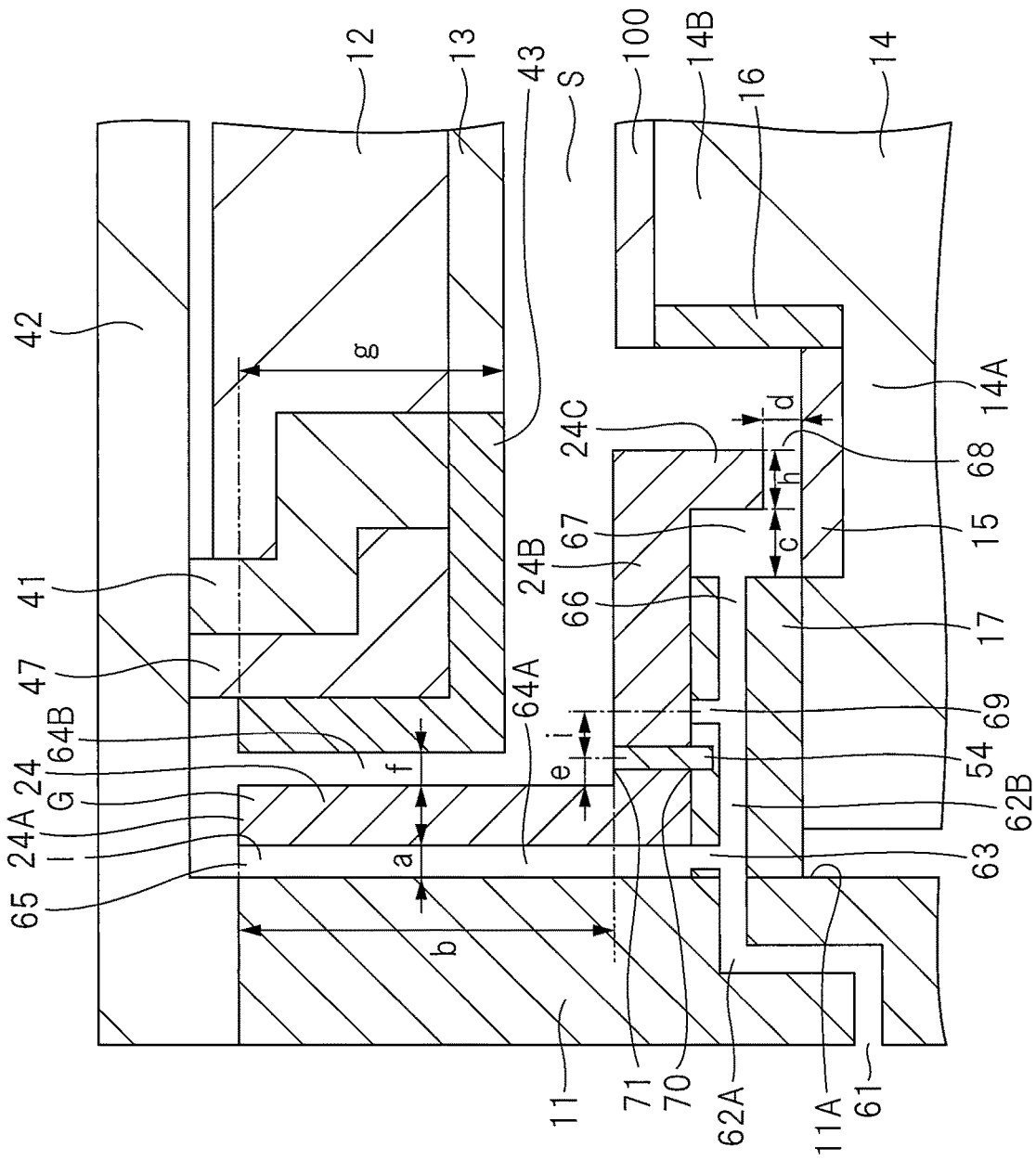
FIG. 2 is an enlarged cross-sectional view showing an example of a main part of an inert gas supply channel of the atomic layer deposition apparatus shown in FIG. 1.
Figure 3:
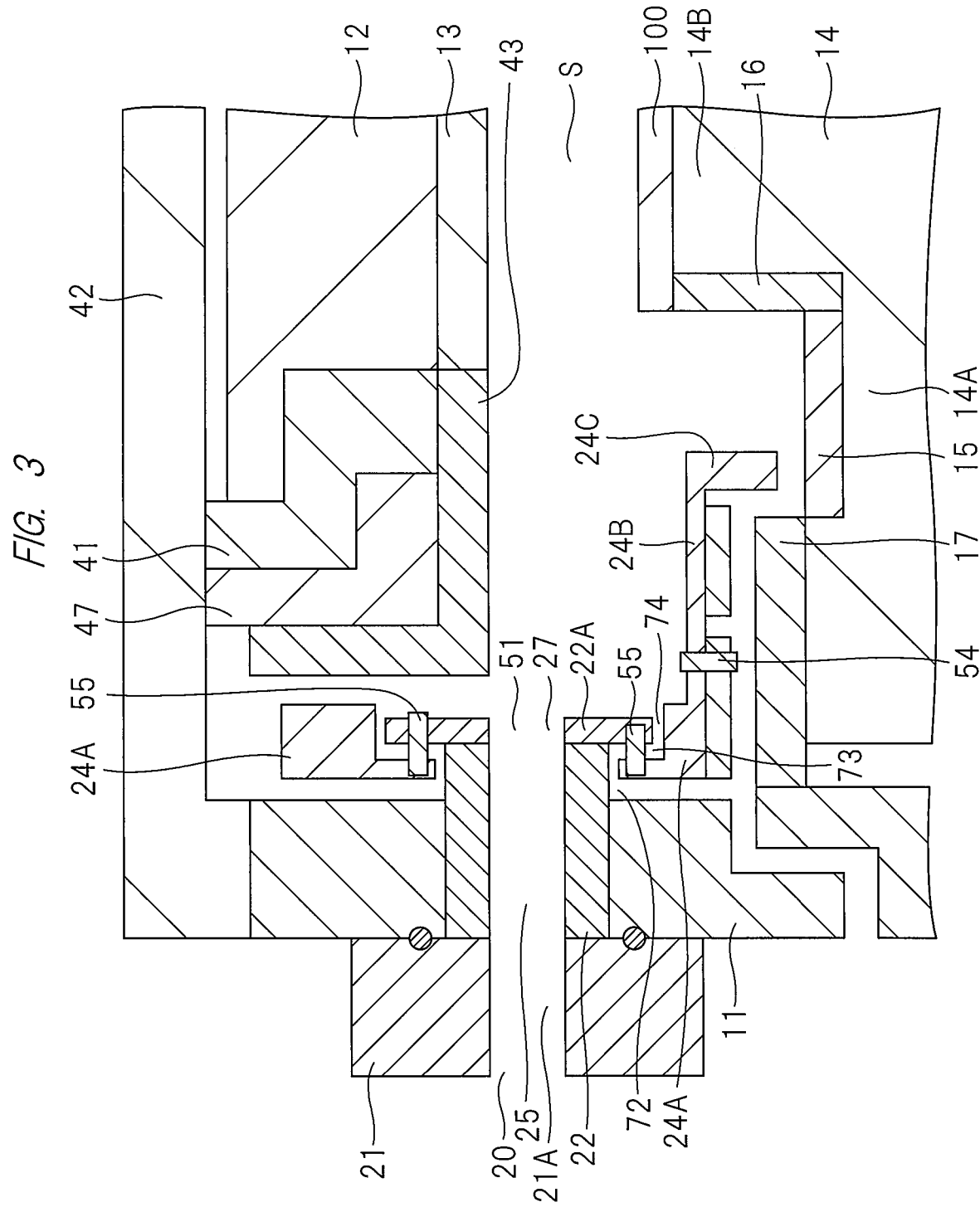
FIG. 3 is an enlarged cross-sectional view showing an example of a main part of a structure cut along a gas inlet side opening of the atomic layer deposition apparatus shown in FIG. 1.
Figure 4:
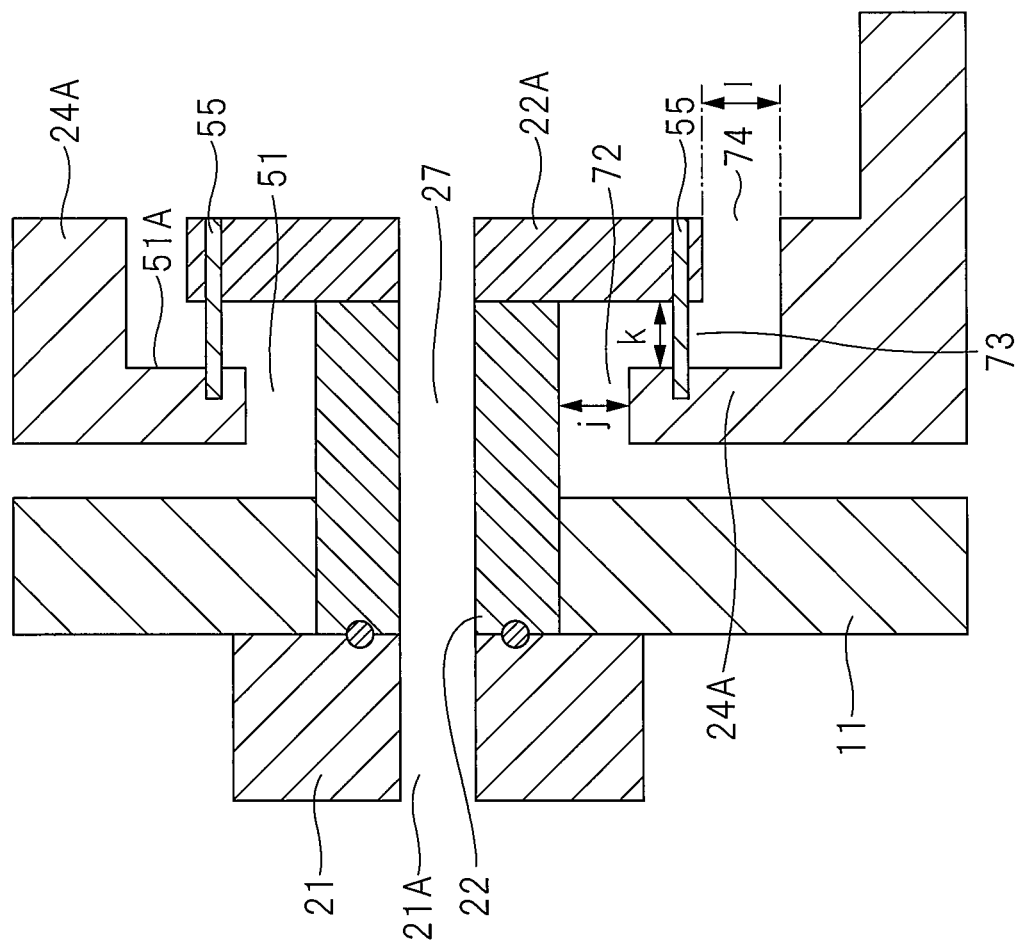
FIG. 4 is an enlarged cross-sectional view partially showing an example of a structure in the vicinity of the gas inlet side opening shown in FIG. 3.

FIG. 2 is an enlarged cross-sectional view showing an example of a main part of the inert gas supply channel of the atomic layer deposition apparatus shown in FIG. 1, FIG. 3 is an enlarged cross-sectional view showing an example of a main part of a structure cut along the gas inlet side opening of the atomic layer deposition apparatus shown in FIG. 1, and FIG. 4 is an enlarged cross-sectional view partially showing an example of a structure in the vicinity of the gas inlet side opening shown in FIG. 3. Note that FIG. 2 is also an enlarged view of a periphery of a stage stopper 17 when viewed from a holding surface of the injector 21 parallel to the direction of the gas flow.

The stage stopper 17 is a member provided so as to be in contact with an inner wall 11A of the four side walls of the film-forming container 11, is configured to stop rising of the stage 14 and, when in contact with the stage 14, is configured to partition and form, in the film-forming container 11, the film-forming space S in which the film-forming process is performed and a transporting space T shown in FIG. 1 in which transport of the substrate 100 is performed.

Further, as shown in FIG. 2, the stage 14 includes a stage peripheral portion 14A which is a portion that is lower than the holding surface configured to hold the substrate 100 and is a peripheral portion of the stage 14 internally in contact with the stage stopper 17, and a stage substrate holding portion 14B configured to hold the substrate 100. Further, a peripheral stage deposition prevention member (first stage deposition prevention member) 15 is provided on an upper surface of the stage peripheral portion 14A, and a side stage deposition prevention member (second stage deposition prevention member) 16 is provided on a side portion of the stage substrate holding portion 14B.

Namely, the peripheral stage deposition prevention member 15 covers the stage peripheral portion 14A of the stage 14, whereas the side stage deposition prevention member 16 covers the side portion of the stage substrate holding portion 14B of the stage 14.

In addition, a stage stopper deposition prevention member 24 is provided on the stage stopper 17 so as to cover the stage stopper 17. Further, the stage stopper deposition prevention member 24 is constituted by an outer peripheral portion (first stage stopper deposition prevention member) 24A covering the inner wall 11A of a side (side wall) of the film-forming container 11 at a region above the stage stopper 17, a middle portion (second stage stopper deposition prevention member) 24B covering an upper surface of the stage stopper 17, and an inner peripheral portion (third stage stopper deposition prevention member) 24C covering a side surface (side portion) of the stage stopper 17 on a substrate side.

In the present embodiment, a case where the outer peripheral portion 24A, the middle portion 24B and the inner peripheral portion 24C of the stage stopper deposition prevention member 24 are integrally formed will be described. However, the outer peripheral portion 24A, the middle portion 24B and the inner peripheral portion 24C of the stage stopper deposition prevention member do not always need to be integrally formed and may instead be individually formed and bonded to one another.

In another expression of describing the configuration of the outer peripheral portion 24A of the stage stopper deposition prevention member 24, the outer peripheral portion 24A of the stage stopper deposition prevention member is arranged along each of the inner walls 11A of the four side walls of the film-forming container 11 which form a quadrangular shape in plan view. That is, the outer peripheral portion 24A of the stage stopper deposition prevention member is constituted by four plate-like members G (see FIG. 2) respectively arranged along the inner walls 11A of the film-forming container 11. Further, the four plate-like members G are each in contact with the adjacent plate-like member G. Preferably, no space is formed between the four adjacent plate-like members G. In this manner, the source gas and reaction gas used when forming a thin film over the substrate 100 by the atomic layer deposition apparatus 10 can be prevented from entering a gap between the plate-like members G, whereby a thin film can be suppressed from forming in the gap.

In this manner, it is preferable that the four plate-like members G are also integrally formed such that no space is formed between the adjacent plate-like members G.

In addition, the side stage deposition prevention member (second stage deposition prevention member) 16 covering a side portion of the stage 14 is provided on the stage 14 at a position between the stage 14 and the inner peripheral portion 24C of the stage stopper deposition prevention member.

In the above-described manner, in the atomic layer deposition apparatus 10 of the present embodiment, the stage 14 and the periphery (peripheral portion) of the stage 14 are covered by the side stage deposition prevention member 16, the peripheral stage deposition prevention member 15 and the stage stopper 17, and the stage stopper deposition prevention member 24 is arranged along the upper surface of the stage stopper 17 and the inner wall 11A of the four side walls of the film-forming container 11.

Here, details of problems of the present embodiment will be described.

In each step of the film-forming process using the atomic layer deposition method, gas of the next reactant is introduced after waiting for the prior gas to be diffused. At this time, the source gas (such as TMA) used is easily diffused, whereby the source gas easily enters a small gap in the film-forming container and forms a film. For example, the source gas or reaction gas enters a small gap formed in the stage 14 provided in the film-forming container and members in the periphery of the stage 14, whereby a thin film is formed in the small gap. The thin film causes generation of particles, resulting in a problem in which properties of the thin film formed over the substrate 100 are deteriorated. Particularly, in a large area type atomic layer deposition apparatus configured to accommodate a large glass substrate, the stage 14 becomes larger as the substrate 100 to be processed becomes larger, whereby a flatness of the stage 14 is reduced as the stage 14 becomes larger. In this manner, a size of a gap in the partitioned part formed by contact between the stage 14 and the stage stopper 17 increases, and generation of particles becomes more conspicuous.

In the film-forming apparatus such as a CVD apparatus, excessive film in the chamber is removed by dry etching. Namely, excessive film is removed without disassembling the chamber by flowing a cooling gas (such as $NF_3$) and forming plasma.

However, an alumina ($Al_2O_3$) film used in the atomic layer deposition apparatus is subjected to a high temperature process (for example, at 800° C.) when dry etching is performed, which is costly.

In addition, in the atomic layer deposition apparatus that uses plasma to form an insulating film, the part to be partitioned is insulated by deposition of the film, whereby the amount of the high-frequency current flowed between the stage 14 and the stage stopper 17 changes as the film-forming process is repeated, resulting in a problem in which film-forming repeatability is reduced. In addition, the high-frequency current flowed to the stage 14 is concentrated in the vicinity of the stage stopper 17, whereby arcing is likely to occur in a portion where a gap or unevennesses are present. Thus, it is necessary to minimize the number of joints and screws for the deposition prevention plate which become a source of arcing.

In addition, the number of deposition prevention plates increases as the atomic layer deposition apparatus becomes larger, resulting in a problem in which time required for maintenance increases. The three surfaces of the stage stopper exposed to the source gas and reaction gas are a plate electrode surface, the substrate-side side surface, and a stage surface (the holding surface of the stage 14), whereby covering each of the surfaces with the deposition prevention plate causes a significant increase in the number of deposition prevention plates.

In addition, maintenance of the film-forming container 11 is performed by releasing a top plate 42 of the film-forming container 11 and reaching into the film-forming space S from above the film-forming container 11; however, access to the deposition prevention plates of the side and stage surfaces of the stage stopper 17 at the time of maintenance is difficult, whereby maintenance workability becomes very poor.

Thus, it is desired that the deposition prevention plate in the vicinity of the stage stopper 17 of the atomic layer deposition apparatus has a structure in which film deposition to regions other than the surface of the deposition prevention plate is suppressed and in which the deposition prevention plate can be easily attached and removed.

In the atomic layer deposition apparatus 10 of the present embodiment, the stage 14 and the periphery (peripheral portion) of the stage 14 is covered by the side stage deposition prevention member 16, the peripheral stage deposition prevention member 15 and the stage stopper 17. Further, the upper surface of the stage stopper 17 is covered by the stage stopper deposition prevention member 24. Furthermore, the stage stopper deposition prevention member 24 is arranged along the inner wall 11A of the four side walls of the film-forming container 11.

In addition, the atomic layer deposition apparatus 10 of the present embodiment has a gap that allows inert gas to be supplied between the inner wall 11A of the film-forming container 11 and the stage stopper deposition prevention member 24.

Further, an upper inert gas supply port (first inert gas supply port) 63 configured to supply the inert gas to an upper inert gas supply channel (first inert gas supply channel) 64A formed by the gap between the outer peripheral portion 24A of the stage stopper deposition prevention member and the film-forming container 11 is formed in the stage stopper 17. In addition, a lower inert gas supply port (second inert gas supply port) 66 configured to supply the inert gas to a lower inert gas supply channel (second inert gas supply channel) 67 formed by a gap between the inner peripheral portion 24C of the stage stopper deposition prevention member and the stage stopper 17 and a gap between the peripheral stage deposition prevention member 15 and the inner peripheral portion 24C of the stage stopper deposition prevention member is formed in the stage stopper 17.

Further, an inert gas supply channel 62A configured to supply the inert gas to the upper inert gas supply port 63 and the lower inert gas supply port 66 is formed in the film-forming container 11, and likewise, an inert gas supply channel 62B configured to supply the inert gas to the upper inert gas supply port 63 and the lower inert gas supply port 66 and communicating with the inert gas supply channel 62A is formed in the stage stopper 17. In addition, an inert gas supply portion 61 configured to supply the inert gas to the inert gas supply channel 62A is formed in the film-forming container 11.

In addition, a middle inert gas supply port (third inert gas supply port) 69 configured to supply the inert gas to a middle inert gas supply channel (third inert gas supply channel) 70 formed by a gap between the middle portion 24B of the stage stopper deposition prevention member and the upper surface of the stage stopper 17 is formed in the stage stopper 17.

The stage stopper 17 may be integrally formed with the film-forming container 11, or the stage stopper 17 may be fixed to the film-forming container 11 by screws or the like.

Figure 5:
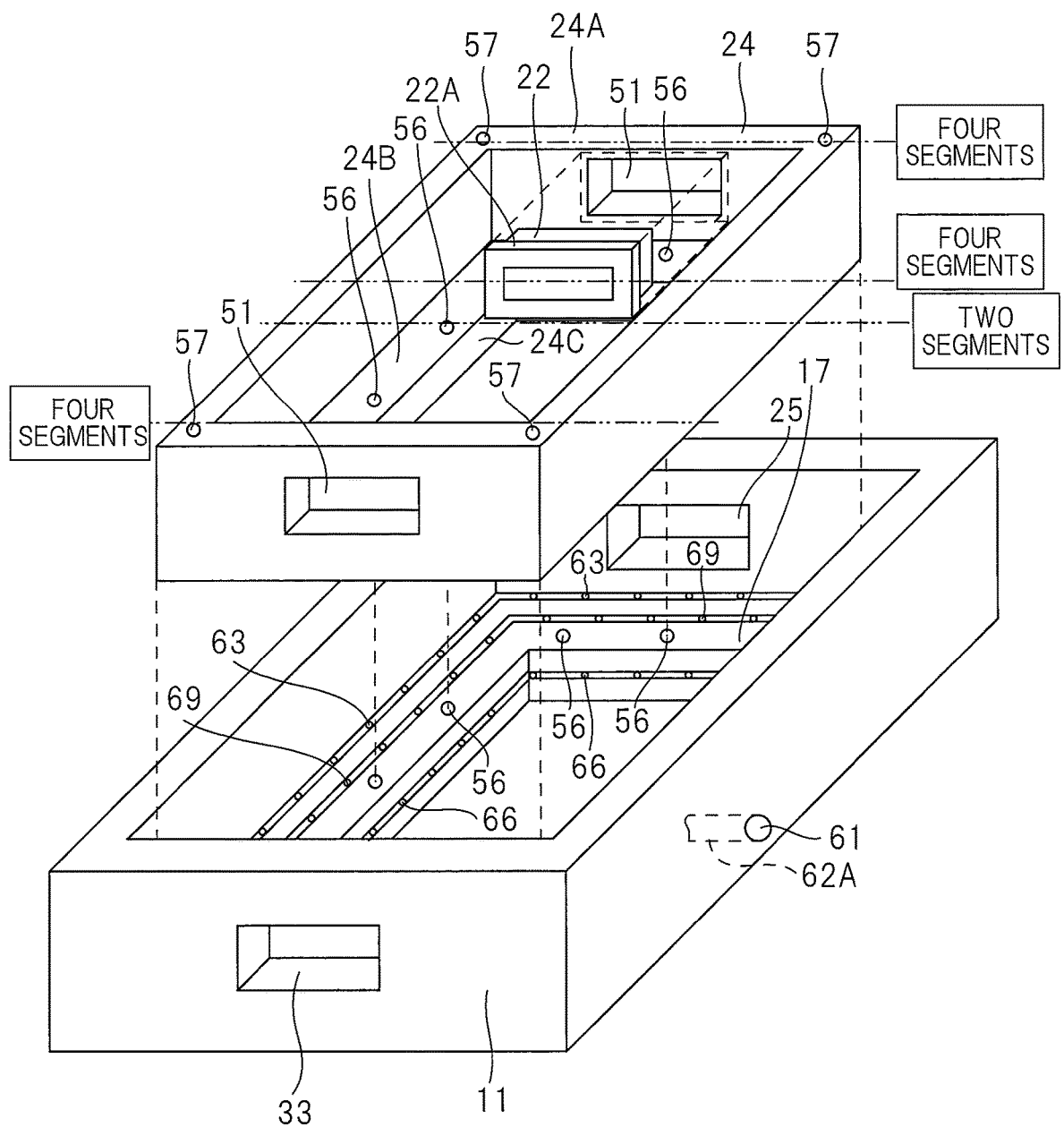
FIG. 5 is an enlarged perspective view showing an example of a relation between a portion of a film-forming container, a stage stopper and a stage stopper deposition prevention member of the atomic layer deposition apparatus shown in FIG. 1.

In addition, as shown in FIG. 5 described below, a plurality of upper inert gas supply ports 63 are formed along the entire periphery of the vicinity of the upper surface of the stage stopper 17, or the upper inert gas supply port 63 is continuously formed along the entire periphery of the vicinity of the upper surface of the stage stopper 17. Likewise, a plurality of lower inert gas supply ports 66 are formed along an entire periphery of the substrate-side side surface of the stage stopper 17, or the lower inert gas supply port 66 is continuously formed along the entire periphery of the substrate-side side surface of the stage stopper 17. Likewise, a plurality of middle inert gas supply ports 69 are formed along the entire periphery of the upper surface of the stage stopper 17, or the middle inert gas supply port 69 is continuously formed along the entire periphery of the upper surface of the stage stopper 17.

Here, as shown in FIG. 2, the inert gas supplied via the upper inert gas supply channel 64A flows from an upper inert gas discharge port 65, passes through an upper inert gas supply channel 64B formed by a gap between the outer peripheral portion 24A of the stage stopper deposition prevention member and a side surface of the upper insulating deposition prevention member 43, and is supplied to the film-forming space S.

Next, examples of dimensions of each part in the film-forming container 11 will be described.

A size (distance a) of the gap between the outer peripheral portion 24A of the stage stopper deposition prevention member and the film-forming container 11 configuring the upper inert gas supply channel 64A is preferably greater than or equal to 0.1 mm and less than or equal to 30 mm. By making the distance a small, entry of the source gas and reaction gas into the upper inert gas supply channel 64A is suppressed, whereby film deposition on the film-forming container 11 and the stage stopper 17 can be suppressed.

However, in a case where the distance a is too small, the film-forming container 11 and the stage stopper deposition prevention member 24 may interfere with each other depending on processing accuracy. Particularly, in a case where the stage stopper deposition prevention member 24 of the atomic layer deposition apparatus 10 configured to accommodate a large area glass substrate is not divided, this phenomenon becomes more conspicuous. Thus, in the atomic layer deposition apparatus 10 configured to accommodate a glass substrate having a size of, for example, 370 mm×470 mm, a suitable value for the distance a is necessary, and in the present embodiment, the distance a is set to 3 mm.

In addition, a distance (distance b) between an upper surface of the outer peripheral portion 24A and an upper surface of the middle portion 24B of the stage stopper deposition prevention member in a vertical direction is preferably greater than or equal to 10 mm. By making the distance b large, entry of the source gas and reaction gas into the upper inert gas supply channel 64A is suppressed, whereby film deposition on the film-forming container 11 and the stage stopper 17 can be suppressed. In a case where the distance b is small, the source gas and reaction gas would enter the upper inert gas supply channel 64A, whereby film deposition would occur. Thus, a suitable value for the distance b is necessary, and in the present embodiment, the distance b is set to 100 mm.

In addition, a size (distance f) of the gap between the outer peripheral portion 24A of the stage stopper deposition prevention member and the side surface (side portion) of the upper insulating deposition prevention member 43 configuring the upper inert gas supply channel 64B is preferably greater than or equal to 1 mm and less than or equal to 50 mm. By making the distance f small, entry of the source gas and reaction gas into the upper inert gas supply channel 64B is suppressed, whereby film deposition on the film-forming container 11 and the stage stopper 17 can be suppressed. However, in a case where the distance f is too small, the outer peripheral portion 24A of the stage stopper deposition prevention member and the upper insulating deposition prevention member 43 may interfere with each other depending on processing accuracy. Particularly, in a case where the stage stopper deposition prevention member 24 of the atomic layer deposition apparatus 10 configured to accommodate a large area glass substrate is not divided, this phenomenon becomes more conspicuous. Thus, in the atomic layer deposition apparatus 10 configured to accommodate a large area glass substrate having a size of, for example, 370 mm×470 mm, a suitable value for the distance f is necessary, and in the present embodiment, the distance f is set to 3 mm.

In addition, a distance (distance g) between lower and upper surfaces of the side portion of the upper insulating deposition prevention member 43 is preferably greater than or equal to 1 mm and less than or equal to 300 mm. By making the distance g large, entry of the source gas and reaction gas into the upper inert gas supply channel 64B is suppressed, whereby film deposition on the film-forming container 11 and the stage stopper 17 can be suppressed. In the present embodiment, the distance g is set to 50 mm.

Note that the inert gas supplied from the lower inert gas supply channel 67 is supplied to the film-forming space S via a lower inert gas discharge port 68.

At this time, a size (distance c) of the gap between the inner peripheral portion 24C of the stage stopper deposition prevention member and the stage stopper 17 configuring the lower inert gas supply channel 67 is preferably greater than or equal to 0.1 mm and less than or equal to 30 mm. By making the distance c small, entry of the source gas and reaction gas into the lower inert gas supply channel 67 is suppressed, whereby film deposition on the stage stopper 17 can be suppressed. However, in a case where the distance c is too small, the inner peripheral portion 24C of the stage stopper deposition prevention member and the stage stopper 17 may interfere with each other depending on processing accuracy. Particularly, in a case where the stage stopper deposition prevention member 24 of the atomic layer deposition apparatus 10 configured to accommodate a large area glass substrate is not divided, this phenomenon becomes more conspicuous. Thus, in the atomic layer deposition apparatus 10 configured to accommodate a large area glass substrate having a size of, for example, 370 mm×470 mm, a suitable value for the distance c is necessary, and in the present embodiment, the distance c is set to 3 mm.

In addition, a size (distance d) of the gap between the inner peripheral portion 24C of the stage stopper deposition prevention member and the peripheral stage deposition prevention member 15 configuring the lower inert gas supply channel 67 is preferably greater than or equal to 0.1 mm and less than or equal to 30 mm. By making the distance d small, entry of the source gas and reaction gas into the lower inert gas supply channel 67 is suppressed, whereby film deposition on the stage stopper 17 can be suppressed. However, in a case where the distance d is too small, the inner peripheral portion 24C of the stage stopper deposition prevention member and the peripheral stage deposition prevention member 15 may interfere with each other depending on processing accuracy. Particularly, in a case where the stage stopper deposition prevention member 24 of the atomic layer deposition apparatus 10 configured to accommodate a large area glass substrate is not divided, this phenomenon becomes more conspicuous. Thus, in the atomic layer deposition apparatus 10 configured to accommodate a large area glass substrate having a size of, for example, 370 mm×470 mm, a suitable value for the distance d is necessary, and in the present embodiment, the distance d is set to 3 mm.

In addition, a thickness (distance h) of the inner peripheral portion 24C of the stage stopper deposition prevention member configuring the lower inert gas supply channel 67 is preferably greater than or equal to 1 mm and less than or equal to 100 mm. By making the distance h large, entry of the source gas and reaction gas into the lower inert gas supply channel 67 is suppressed, whereby film deposition on the stage stopper 17 can be suppressed. However, in a case where the distance h is too large, a weight of the middle portion 24B of the stage stopper deposition prevention member increases, whereby maintainability is reduced. Thus, a suitable value for the distance h is necessary, and in the present embodiment, the distance h is set to 20 mm.

In addition, the middle portion 24B of the stage stopper deposition prevention member and the upper surface of the stage stopper 17 configuring the middle inert gas supply channel 70 are internally in contact with each other; however, a lower surface of the middle portion 24B of the stage stopper deposition prevention member may be intentionally designed to have a rough surface (for example, Ra (arithmetic mean roughness)=1 μm to 6 μm). This rough surface provides the middle inert gas supply channel 70 in which gas is flowed. That is, a screw hole 56 (see FIG. 5 described below) of a fixing screw 54 for fixing the middle portion 24B of the stage stopper deposition prevention member and the stage stopper 17 becomes a middle inert gas discharge port 71, whereby the inert gas is partially supplied to the film-forming space S via the screw hole 56. In this manner, film deposition on the fixing screw 54 can be reduced.

In addition, a shortest horizontal distance (distance e) between the fixing screw 54 and an end surface of the outer peripheral portion 24A of the stage stopper deposition prevention member on aside of the film-forming space is preferably greater than or equal to 0.1 mm and less than or equal to 50 mm. The screw portion is likely to become sources of arcing and particles, and thus, it is preferable that the distance e is set to be far from the film-forming space S. However, in a case where the distance e is small, fixing the screw becomes difficult, whereby maintainability is reduced. Thus, a suitable value for the distance e is necessary, and in the present embodiment, the distance e is set to 20 mm.

In addition, a shortest horizontal distance (distance i) between the middle inert gas supply port 69 and the fixing screw 54 is preferably less than or equal to 100 mm, and in the present embodiment, the distance i is set to 10 mm. By making the distance i small, the inert gas is preferentially supplied to the screw hole 56 of the fixing screw 54, whereby film deposition on an inner surface of the middle inert gas discharge port 71 can be suppressed.

An inert gas supply channel 62B communicating with the upper inert gas supply port 63, the lower inert gas supply port 66 and the middle inert gas supply port 69 is formed in the stage stopper 17, and a terminal end of the inert gas supply channel 62B communicates with the inert gas supply channel 62A provided in the film-forming container 11. The inert gas supply channel 62A and the inert gas supply channel 62B form a through hole in the film-forming container 11 and the stage stopper 17, and the inert gas can be supplied by interposing, for example, an O-ring between both supply channels. The other end of the inert gas supply channel 62A is connected to the inert gas supply portion 61 provided in the film-forming container 11.

FIG. 3 is an enlarged view of the periphery of the stage stopper 17 and injector 21 when viewed from a side surface of the film-forming container 11 parallel to the direction of the gas flow. In the atomic layer deposition apparatus 10 using laminar flow, the gas inlet 20 and the outlet 30 shown in FIG. 1 are provided in the side surface (side wall) of the film-forming container 11, whereby it is necessary to provide an opening (deposition prevention member opening 51) in the outer peripheral portion 24A of the stage stopper deposition prevention member on each of the inlet and outlet sides of the film-forming container 11.

Here, the injector 21 and the outlet flange 31 provided on an outer wall of the film-forming container 11 will be described.

As shown in FIGS. 3 and 4, the injector 21 provided on the gas inlet side has an opening (first opening) 21A and is arranged such that positions of the gas inlet side opening 25 of the film-forming container 11 and the opening 21A are aligned. In addition, the injector deposition prevention member 22 serving as the deposition prevention member for the injector 21 is inserted and attached to the gas inlet side opening 25 so as to be in the film-forming container 11 at a position more inward than the injector 21.

On the other hand, as shown in FIG. 1, the outlet flange 31 provided on the gas outlet side has an opening (second opening) 31A and is arranged such that positions of the gas outlet side opening 33 of the film-forming container 11 and the opening 31A are aligned. In addition, the outlet deposition prevention member 32 serving as the deposition prevention member for the outlet flange 31 is inserted and attached to the gas outlet side opening 33 so as to be in the film-forming container 11 at a position more inward than the outlet flange 31.

Further, each of the injector deposition prevention member 22 and the outlet deposition prevention member 32 includes a flange (injector deposition prevention member flange 22A shown in FIG. 3 and outlet deposition prevention member flange 32A shown in FIG. 1) in the film-forming container 11. The flange is larger than the gas inlet side opening 25 and the gas outlet side opening 33.

As shown in FIG. 3, the outer peripheral portion 24A of the stage stopper deposition prevention member has one or a plurality of deposition prevention member openings 51 that allow the injector deposition prevention member 22 and the outlet deposition prevention member 32 to be inserted and attached thereto, and the flange of each of the injector deposition prevention member 22 and the outlet deposition prevention member 32 is larger than the deposition prevention member opening 51.

That is, a deposition prevention member opening 27 of the injector deposition prevention member 22 has the same size as the gas inlet side opening 25, and the injector deposition prevention member 22 can be inserted from a side of the film-forming container 11 and attached thereto.

Further, the injector deposition prevention member 22 includes the injector deposition prevention member flange 22A on the side of the film-forming container 11. The injector deposition prevention member flange 22A is larger than the gas inlet side opening 25 and the deposition prevention member opening 27.

In addition, the deposition prevention member opening 51 preferably has a recess 51A as shown in FIG. 4 that is larger than an outer diameter of the injector deposition prevention member flange 22A by 0.1 mm or more, is larger than a thickness of the injector deposition prevention member flange 22A by 0.1 mm or more, and is capable of housing the injector deposition prevention member flange 22A. The recess 51A is a portion in which the flange is disposed and allows unevennesses caused by the outer peripheral portion 24A of the stage stopper deposition prevention member and the injector deposition prevention member flange 22A to be suppressed as much as possible, and as a result, uniform supplying of the source gas and reaction gas can be maintained.

As shown in FIG. 4, a gap between the outer peripheral portion 24A of the stage stopper deposition prevention member and the injector deposition prevention member 22 configures an inert gas supply port 72 of the gas inlet for supplying the inert gas. In addition, a gap between the outer peripheral portion 24A of the stage stopper deposition prevention member, the injector deposition prevention member 22 and the injector deposition prevention member flange 22A configures an inert gas supply channel 73 of the gas inlet. Further, a gap between the outer peripheral portion 24A of the stage stopper deposition prevention member and the injector deposition prevention member flange 22A configures an inert gas discharge port 74 of the gas inlet.

A size (distance j) of the gap between the outer peripheral portion 24A of the stage stopper deposition prevention member and the injector deposition prevention member 22 shown in FIG. 4 and sizes (distances k and l) of the gaps between the outer peripheral portion 24A of the stage stopper deposition prevention member and the injector deposition prevention member flange 22A are preferably greater than or equal to 0.1 mm and less than or equal to 10 mm. By making the distances j, k and l small, entry of the source gas and reaction gas into the inert gas supply channel 73 of the gas inlet is suppressed, whereby film deposition on the film-forming container 11 and the stage stopper 17 can be suppressed. However, since a channel width of the upper inert gas supply channel 64A is set to 3 mm in the present embodiment, in a case where the distances j, k and l are too small, the amount of the inert gas supplied to the inert gas supply channel 73 of the gas inlet is reduced. Thus, suitable values for the distances j, k and l are necessary, and in the present embodiment, the distances j, k and l are set to 1 mm.

In addition, a screw hole is formed in each of an inner surface of the injector deposition prevention member flange 22A and an inner wall of the outer peripheral portion 24A of the stage stopper deposition prevention member, and a fixing screw 55 is arranged therebetween such that a gap is provided between the inner surfaces while the injector deposition prevention member 22 is arranged in the deposition prevention member opening 51. A distance between the injector deposition prevention member flange 22A and the inner wall of the outer peripheral portion 24A of the stage stopper deposition prevention member can be adjusted by using, for example, a 1 mm shim at the screw portion.

Descriptions of the gas inlet 20 can also be applied to the outlet 30 shown in FIG. 1. A plurality of gas inlet side openings 25 may be provided, and in a case of the atomic layer deposition apparatus 10 having, for example, two gas inlet side openings 25 and two gas outlet side openings 33, the atomic layer deposition apparatus 10 has four deposition prevention member openings 51 shown in FIG. 4.

Figure 6:
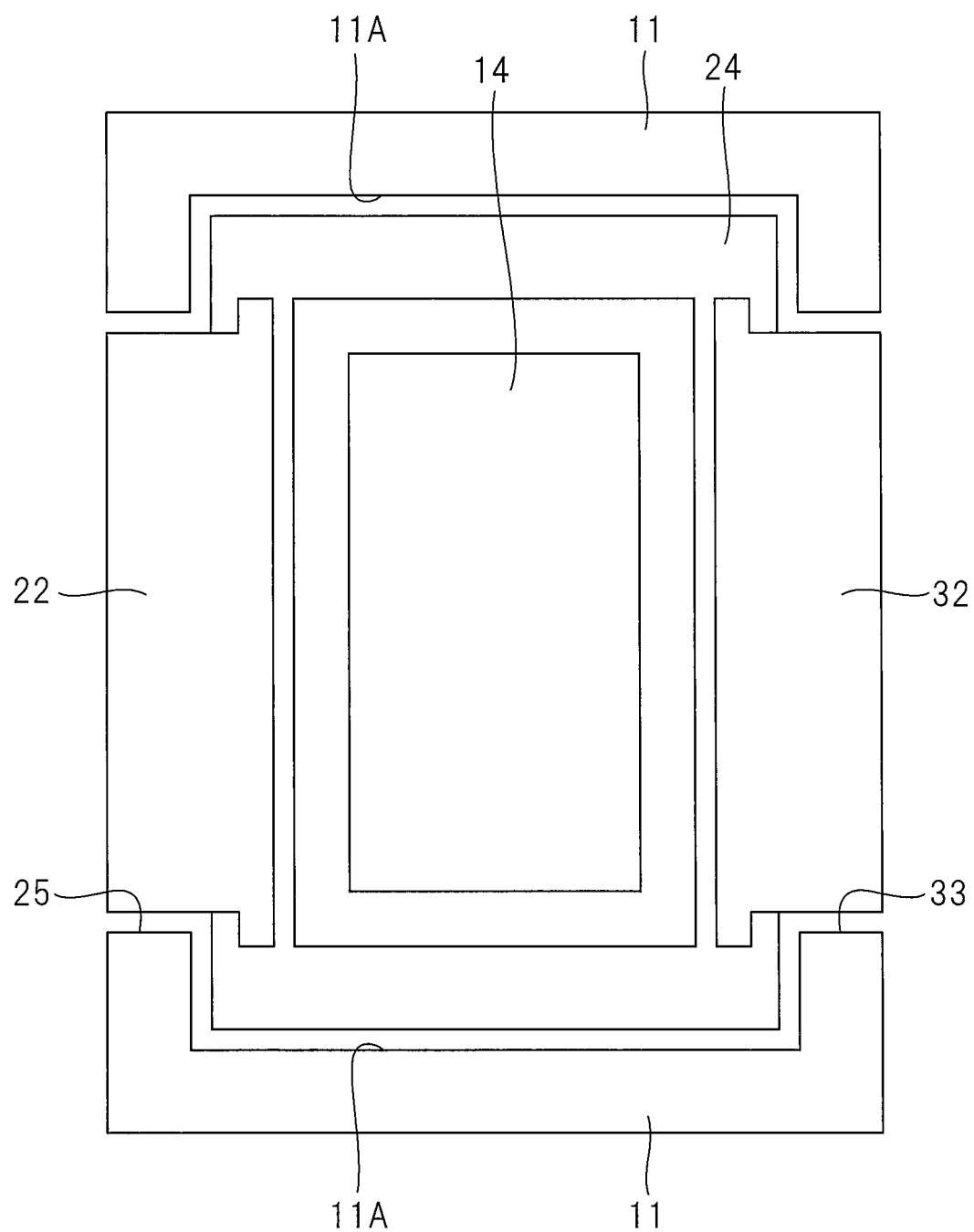
FIG. 6 is an enlarged plan view showing an example of a positional relation between the film-forming container, the stage and the stage stopper deposition prevention member of the atomic layer deposition apparatus shown in FIG. 1.

Next, a positional relation between the stage 14, the stage stopper deposition prevention member 24 and the film-forming container 11, and each of the supply ports of the stage stopper deposition prevention member 24 will be described. FIG. 5 is an enlarged perspective view showing an example of a relation between a portion of the film-forming container, the stage stopper and the stage stopper deposition prevention member of the atomic layer deposition apparatus shown in FIG. 1, and FIG. 6 is an enlarged plan view showing an example of the positional relation between the film-forming container, the stage and the stage stopper deposition prevention member of the atomic layer deposition apparatus shown in FIG. 1.

As shown in FIG. 5, an opening is formed in both upper and lower sides of the stage stopper deposition prevention member 24, and as shown in FIGS. 2 and 3, the plate electrode 12 is arranged in the vicinity of the opening on the upper side. On the other hand, the stage 14 is arranged in the vicinity of the opening on the lower side. Further, as shown in FIG. 6, the stage stopper deposition prevention member 24 is arranged so as to surround the stage 14 in plan view as well as being arranged along the inner wall 11A of the side wall of the film-forming container 11. Further, the injector deposition prevention member 22 is arranged in the gas inlet side opening 25 of the film-forming container 11, whereas the outlet deposition prevention member 32 is arranged in the gas outlet side opening 33.

As shown in FIG. 5, the inert gas supplied from the upper inert gas supply port 63, the lower inert gas supply port 66 and the middle inert gas supply port 69 is preferably shower-fed from an entire periphery of each of the supply ports. A shower hole in each of the supply ports has a diameter that preferably falls within a range of 1 mm to 3 mm, where a diameter of approximately 1 mm is sufficient. A pitch between the shower holes is preferably 10 mm to 200 mm, and in the present embodiment, the pitch is set to 100 mm. In addition, a shower may be formed by providing a through hole in the stage stopper 17, or a shower plate may be individually formed and attached to the stage stopper 17. A single inert gas supply portion 61 is provided in the structure shown in FIG. 5; however, it is preferable to provide a plurality of inert gas supply portions 61.

It is desired that the stage stopper 17 is not divided; however, in a large area type atomic layer deposition apparatus 10 configured to accommodate a substrate having a size of approximately 1 m on one side, the stage stopper 17 may have a divided structure. In such a case, the stage stopper 17 of the atomic layer deposition apparatus 10 configured to accommodate a large area glass substrate having a size of, for example, 730 mm×920 mm may be divided into two or four segments, and when dividing the stage stopper 17, it is preferable that the stage stopper 17 is divided at corresponding cutting surfaces (for two or four segments) shown in FIG. 5, rather than being divided at the outer peripheral portion 24A, the middle portion 24B and the inner peripheral portion 24C of the stage stopper deposition prevention member. In this manner, a cross-sectional area resulting from dividing the stage stopper 17 can be kept to a minimum, and as a result, entry of the source gas and reaction gas onto the cutting surface can be suppressed. In addition, a decrease in maintainability can be suppressed.

In addition, it is preferable that a female screw tap 57 for inserting an eye bolt is provided on the outer peripheral portion 24A of the stage stopper deposition prevention member. In a case where the stage stopper deposition prevention member 24 is not divided or even in a case where the stage stopper deposition prevention member 24 is divided, and the stage stopper deposition prevention member 24 is made of, for example, stainless steel or the like, a weight of the stage stopper deposition prevention member 24 would increase, whereby manual operation would become difficult. Since an overhead crane may need to be used to transport the stage stopper deposition prevention member 24 in this case, an eye bolt is inserted into the female screw tap 57 to allow the stage stopper deposition prevention member 24 to be suspended by the overhead crane via the eye bolt and transported by the overhead crane.

According to the atomic layer deposition apparatus 10 of the present embodiment, when the stage stopper 17 is in contact with the stage 14, film deposition and generation of powders in the vicinity of the stage stopper 17 partitioning the film-forming space S and the transporting space T can be suppressed.

That is, the side stage deposition prevention member 16 and the peripheral stage deposition prevention member 15 are provided on the stage 14, the stage stopper 17 is arranged on a portion of the stage peripheral portion 14A, and the stage stopper deposition prevention member 24 is provided on the stage stopper 17, whereby a gap formed in each member or formed between members in the vicinity of the stage 14 and the stage stopper 17 can be covered by the deposition prevention member.

In this manner, it is possible to reduce formation of a thin film and adhesion of powders in the gaps. Particularly, the source gas such as TMA used in the atomic layer deposition apparatus 10 has a strong diffusibility, whereby the source gas can easily enter the gaps in the film-forming container 11; however, since the gaps are covered by the deposition prevention members such as the side stage deposition prevention member 16, the peripheral stage deposition prevention member 15 and the stage stopper deposition prevention member 24, entry of the source gas into the gaps can be prevented. As a result, generation of particles formed by the thin film, powders and the like can be suppressed.

Therefore, generation of particles in the film-forming container 11 is suppressed, whereby film quality of the thin film formed over the substrate 100 can be improved.

In addition, the stage stopper deposition prevention member can be easily attached or removed, whereby maintenance workability of the film-forming container 11 and each of the deposition prevention members can be improved.

In addition, since the outer peripheral portion 24A, the middle portion 24B and the inner peripheral portion 24C of the stage stopper deposition prevention member are integrally formed as the stage stopper deposition prevention member 24, no gap is formed directly in the stage stopper deposition prevention member 24, whereby generation of particles can be further reduced as compared to a case where the stage stopper deposition prevention member 24 is divided and formed.

However, the stage stopper deposition prevention member 24 may be formed so as to be divisible. Namely, in a large area type atomic layer deposition apparatus 10 configured to accommodate a substrate having a size of approximately 1 m on one side, the stage stopper deposition prevention member 24 may have a divisible structure. In such a case, it is preferable that the stage stopper deposition prevention member 24 is divided at corresponding cutting surfaces (for two or four segments) shown in FIG. 5, rather than being divided at the outer peripheral portion 24A, the middle portion 24B and the inner peripheral portion 24C of the stage stopper deposition prevention member, as described above. By forming the stage stopper deposition prevention member 24 so as to be divisible instead of being integral in this manner, the stage stopper deposition prevention member 24 can be more easily attached and removed to and from the film-forming container 11.

In addition, by forming the inert gas supply channel 62B in the stage stopper 17, the inert gas can be flowed in the gap between the stage stopper deposition prevention member 24 and the peripheral stage deposition prevention member 15, the gap between the stage stopper deposition prevention member 24 and the film-forming container 11 and the gap between the stage stopper 17 and the stage stopper deposition prevention member 24 at the time of the film-forming process.

In this manner, entry of the source gas into each of the gaps formed by the corresponding members can be prevented, whereby film deposition on the stage 14, the stage stopper 17 and each of the gaps can be suppressed. As a result, frequency of maintenance of the film-forming container 11 is reduced, whereby an operation rate of the atomic layer deposition apparatus 10 can be improved.

<Atomic Layer Deposition Method>

Next, a procedure (atomic layer deposition method) of the thin film-forming process using the atomic layer deposition apparatus 10 will be described.

Figure 7:
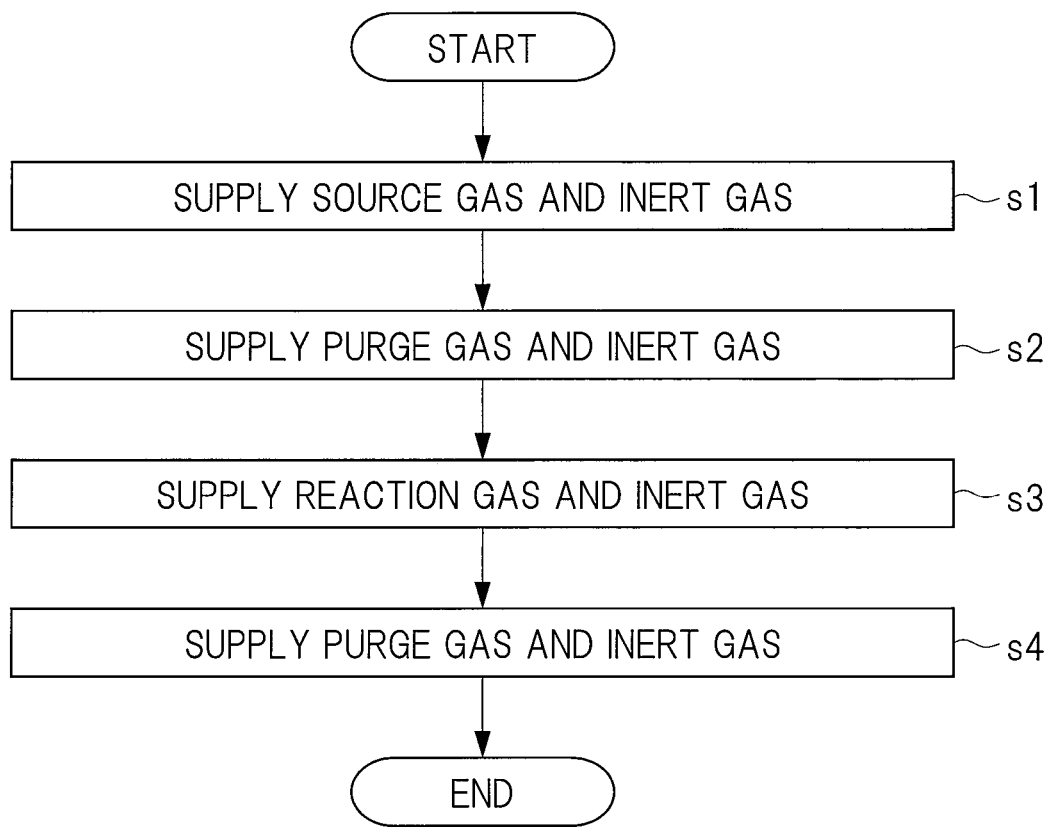
FIG. 7 is a flowchart showing an example of an atomic layer deposition method of the embodiment.

FIG. 7 is a flowchart showing an example of the atomic layer deposition method of the present embodiment, and FIGS. 8(a) to 8(d) are cross-sectional views showing an example of the substrate in the procedure of the thin film-forming process according to the flowchart shown in FIG. 7.

First, the substrate 100 is mounted on the stage 14 provided in the film-forming container 11 shown in FIG. 1.

Figure 8:
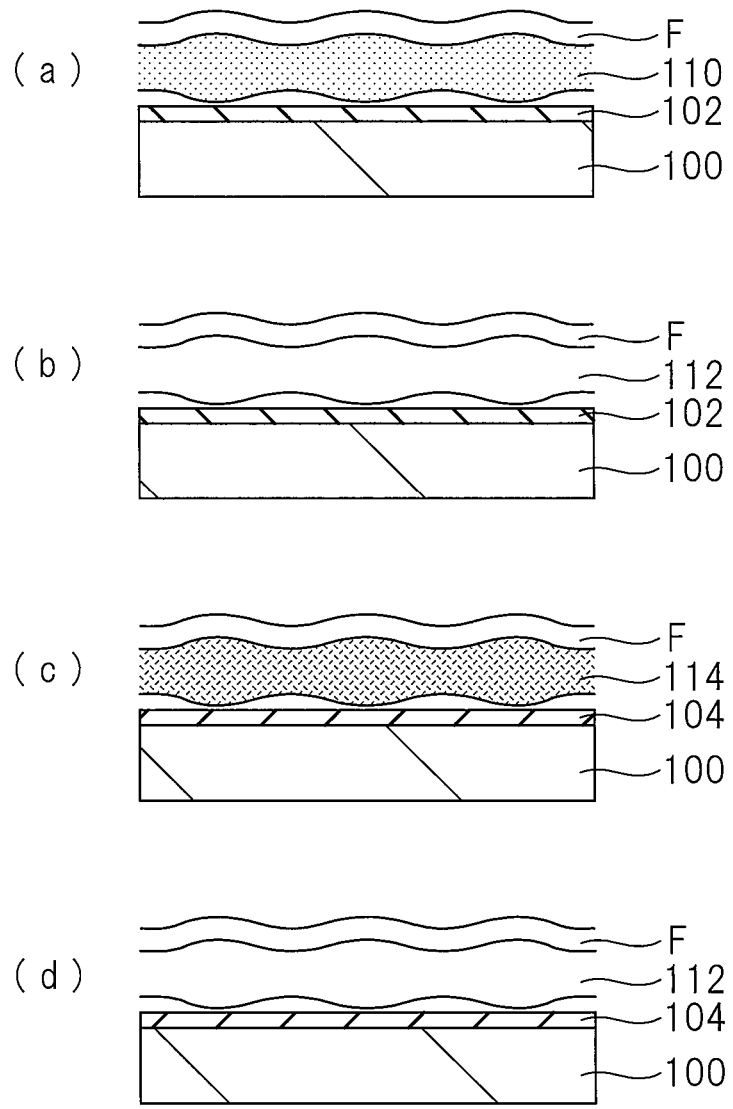
FIGS. 8(a) to 8(d) are cross-sectional views showing an example of a substrate in a procedure of a thin film-forming process according to the flowchart shown in FIG. 7.

Next, a source gas supply unit supplies the source gas into the film-forming container 11 (step s1 shown in FIG. 7). Specifically, the source gas is supplied to the gas inlet 20 of the film-forming container 11 shown in FIG. 1 (step s1). The source gas is, for example, TMA and is supplied into the film-forming container 11. The source gas is supplied into the film-forming container 11 for, for example, 0.1 seconds. As shown in FIG. 8(a), in step s1, the source gas 110 is supplied into the film-forming container 11 and is absorbed onto the substrate 100, whereby an absorption layer 102 is formed.

In addition, in step s1, inert gas F such as nitrogen is supplied from the inert gas supply portion 61 shown in FIG. 2 into the film-forming container 11 shown in FIG. 1. In the present embodiment, the inert gas F is constantly supplied into the film-forming container 11 not only during step s1 but also during steps s2 to s4 described below. In this manner, the inert gas F is supplied to the periphery of the stage stopper 17, the inner wall 11A of the film-forming container 11, and the periphery of the stage including the stage peripheral portion 14A, whereby entry of the source gas 110 into the gaps formed by the corresponding members can be prevented. As a result, film deposition on the gaps and the inner wall 11A of the film-forming container 11 can be suppressed.

Next, supplying of the source gas 110 is stopped, and the purge gas is supplied from the gas inlet 20 (step s2 shown in FIG. 7). The purge gas is supplied into the film-forming container 11. The source gas 110 is discharged outside the film-forming container 11 from the outlet 30 of the film-forming container 11.

The purge gas is supplied into the film-forming container 11 for, for example, 0.1 seconds. Further, the outlet 30 allows the source gas 110 and purge gas 112 in the film-forming container 11 to be exhausted. The outlet 30 allows the source gas 110 and purge gas 112 in the film-forming container 11 to be exhausted for, for example, 2 seconds. As shown in FIG. 8(b), in step s2, the purge gas 112 is supplied into the film-forming container 11, whereby the source gas 110 not absorbed onto the substrate 100 is purged from the film-forming container 11. At this time, the inert gas F is also supplied from the inert gas supply portion 61.

Next, the reaction gas is supplied into the film-forming container 11 (step s3 shown in FIG. 7). Specifically, the reaction gas is supplied through the gas inlet 20 (step s3). The reaction gas passes through a channel of the gas inlet 20 and is supplied into the film-forming container 11. The reaction gas is supplied into the film-forming container 11 for, for example, 1 second. As shown in FIG. 8(c), in step s3, reaction gas 114 is supplied into the film-forming container 11, whereby a desired thin layer 104 is formed over the surface of the substrate 100. The thin layer 104 is, for example, an organic EL protective film. In addition, the inert gas F is supplied from the inert gas supply portion 61 also during step s3.

Next, supplying of the reaction gas is stopped, and the purge gas is supplied to the gas inlet 20 (step s4 shown in FIG. 7). The purge gas 112 is supplied into the film-forming container 11. The purge gas 112 is discharged outside the film-forming container 11 from the outlet 30. The purge gas is supplied into the film-forming container 11 for, for example, 0.1 seconds. The outlet 30 allows the reaction gas 114 and purge gas 112 in the film-forming container 11 to be exhausted outside the film-forming container 11. As shown in FIG. 8(d), in step s4, the purge gas 112 is supplied into the film-forming container 11, whereby the reaction gas 114 is purged from the film-forming container 11. At this time, the inert gas F is also supplied from the inert gas supply portion 61.

By performing steps s1 to s4 described above, the thin layer 104 having a single atomic layer is formed over the substrate 100. Thereafter, steps s1 to s4 are repeated a predetermined number of times such that the thin layer 104 having a desired film thickness can be formed.

As described above, in the atomic layer deposition apparatus 10 of the present embodiment, the inert gas F is supplied from the inert gas supply portion 61 into the film-forming container 11 during the film-forming process (during steps s1 to s4).

Specifically, the inert gas F is introduced into the film-forming container 11 via the inert gas supply channel 62B formed in the stage stopper 17 configured to stop rising of the stage 14 shown in FIG. 2, and the inert gas F is supplied to the periphery of the side portion of the stage 14.

More specifically, the inert gas F is supplied into a gap I between the stage stopper deposition prevention member 24 arranged on the stage stopper 17 and the inner wall 11A of the side wall of the film-forming container 11 via the upper inert gas supply channel (first inert gas supply channel) 64A branched from the inert gas supply channel 62B. In addition, the inert gas F is supplied to the periphery of the side portion of the stage 14 via the lower inert gas supply channel (second inert gas supply channel) 67 formed by the gap between the inner peripheral portion 24C of the stage stopper deposition prevention member and the stage stopper 17 and the gap between the peripheral stage deposition prevention member 15 and the inner peripheral portion 24C of the stage stopper deposition prevention member. Further, the inert gas F is supplied to the gap between the middle portion 24B of the stage stopper deposition prevention member and the stage stopper 17 via the middle inert gas supply channel (third inert gas supply channel) 70 formed by the gap between the middle portion 24B of the stage stopper deposition prevention member and the upper surface of the stage stopper 17.

In the above-described manner, in the atomic layer deposition method of the present embodiment, the inert gas F is continuously flowed in the gap between the stage stopper deposition prevention member 24 and the peripheral stage deposition prevention member 15, the gap between the stage stopper deposition prevention member 24 and the film-forming container 11 and the gap between the stage stopper 17 and the stage stopper deposition prevention member 24 during the film-forming process.

In this manner, a constant pressure can be constantly maintained in the film-forming container 11 during the film-forming process. Particles are likely to generate when the pressure in the film-forming container 11 fluctuates, whereby film quality of the thin film formed over the substrate 100 deteriorates; however, in the atomic layer deposition method of the present embodiment, the inert gas F is continuously flowed during the film-forming process, whereby the pressure in the film-forming container 11 can be constantly maintained and generation of particles can be reduced.

As a result, film quality of the thin film formed over the substrate 100 can be improved.

In addition, by flowing the inert gas F in each of the gaps, entry of the source gas 110 and reaction gas 114 into each of the gaps can be prevented, whereby film deposition on the stage stopper 17 and each of the gaps can be suppressed.

Here, a result of an evaluation performed on formation of an AlON thin film over a large area glass substrate having a size of 370 mm×470 mm by using the atomic layer deposition apparatus 10 according to the present embodiment will be described. Values for the atomic layer deposition apparatus 10 were set to the following.

Distance a: 3 mm, distance b: 100 mm, distance c: 3 mm, distance d: 3 mm, distance e: 20 mm, distance f: 3 mm, distance g: 50 mm, distance h: 20 mm, distance i: 10 mm, distance j: 1 mm, distance k: 1 mm, distance 1:1 mm, diameter of shower hole: 1 mm, pitch between shower holes: 100 mm, and inert gas flow rate: 2000 sccm.

In addition, TMA was used as a liquid source (source gas, Al source), and oxygen plasma and nitrogen plasma were used as the reaction gas. Film-forming was performed according to the sequence shown in FIG. 7. The pressure in the film-forming container 11 was set to 100 Pa, 2000 sccm of nitrogen was supplied from the upper inert gas supply channels 64A and 64B and the lower inert gas supply channel 67 as the inert gas F, and the inert gas F was constantly supplied during the film-forming sequence.

After the film-forming process was performed such that the film thickness in the film-forming container 11 was 20 μm, no film deposition on the stage stopper 17 and no generation of powders were observed. By using the stage stopper deposition prevention member 24 not having a divided structure, the stage stopper deposition prevention member 24 was capable of being easily attached and removed by a single operation using an overhead crane although the weight was heavy, whereby maintainability was significantly improved.

In the foregoing, the invention made by the present inventors has been concretely described based on the embodiment. However, it is needless to say that the present invention is not to be limited to the foregoing embodiment, and various modifications and alterations can be made within the scope of the present invention.

For example, the atomic layer deposition apparatus 10 described in the foregoing embodiment may be configured to perform the film-forming process by using plasma, or may be configured to perform the film-forming process without using plasma.

In addition, in the foregoing embodiment, a case where the thin film formed over the substrate 100 is an organic EL protective film has been described by way of example; however, the thin film may be, for example, a gate insulating film or the like of a MOSFET (Metal Oxide Semiconductor Field Effect Transistor).

LIST OF REFERENCE SIGNS

10: atomic layer deposition apparatus
11: film-forming container
14: stage
14A: stage peripheral portion
14B: stage substrate holding portion
15: peripheral stage deposition prevention member (first stage deposition prevention member)
16: side stage deposition prevention member (second stage deposition prevention member)
17: stage stopper
20: gas inlet
21: injector
22: injector deposition prevention member
24: stage stopper deposition prevention member
24A: outer peripheral portion of the stage stopper deposition prevention member (first stage stopper deposition prevention member)
24B: middle portion of the stage stopper deposition prevention member (second stage stopper deposition prevention member)
24C: inner peripheral portion of the stage stopper deposition prevention member (third stage stopper deposition prevention member)
61: inert gas supply portion
63: upper inert gas supply port (first inert gas supply port)
64A: upper inert gas supply channel (first inert gas supply channel)
64B: upper inert gas supply channel (first inert gas supply channel)
66: lower inert gas supply port (second inert gas supply port)
67: lower inert gas supply channel (second inert gas supply channel)
69: middle inert gas supply port (third inert gas supply port)
70: middle inert gas supply channel (third inert gas supply channel)
100: substrate
110: source gas
112: purge gas
114: reaction gas

The invention claimed is:

1. An atomic layer deposition apparatus comprising:
a film-forming container in which a film-forming process is performed on a substrate;
a vertically movable stage provided in the film-forming container and being configured to hold the substrate;

a stage stopper configured to stop rising of the vertically movable stage and, when in contact with the vertically movable stage, partitioning a film-forming space in which the film-forming process is performed and a transporting space in which transport of the substrate is performed;

a first stage deposition prevention member covering a peripheral portion of the vertically movable stage; and a stage stopper deposition prevention member provided on the stage stopper.

2. The atomic layer deposition apparatus according to claim 1,
wherein the stage stopper deposition prevention member includes:
a first stage stopper deposition prevention member covering an inner surface of a side wall of the film-forming container at a region above the stage stopper;
a second stage stopper deposition prevention member covering an upper surface of the stage stopper; and
a third stage stopper deposition prevention member covering a substrate-side side surface of the stage stopper.

3. The atomic layer deposition apparatus according to claim 2,
wherein the first, second and third stage stopper deposition prevention members are integrally formed with one another.

4. The atomic layer deposition apparatus according to claim 2, further comprising:
a second stage deposition prevention member positioned between the vertically movable stage and the third stage stopper deposition prevention member and covering a side portion of the vertically movable stage.

5. The atomic layer deposition apparatus according to claim 1,
wherein the stage stopper deposition prevention member includes a first stage stopper deposition prevention member arranged along four inner walls of the film-forming container which form a quadrangular shape in plan view,
the first stage stopper deposition prevention member is constituted by four plate-like members respectively arranged along the inner walls, and
the four plate-like members are each in contact with the adjacent plate-like member.

6. The atomic layer deposition apparatus according to claim 5,
wherein each of the four plate-like members configuring the first stage stopper deposition prevention member has no space between the adjacent plate-like member.

7. The atomic layer deposition apparatus according to claim 5, having
a gap that allows inert gas to be supplied between the inner wall of the film-forming container and the stage stopper deposition prevention member.

8. The atomic layer deposition apparatus according to claim 2,
wherein the stage stopper includes:
a first inert gas supply port configured to supply inert gas to a first inert gas supply channel formed by a gap between the first stage stopper deposition prevention member and the film-forming container; and
a second inert gas supply port configured to supply the inert gas to a second inert gas supply channel formed by a gap between the third stage stopper deposition prevention member and the stage stopper and a gap between the third stage stopper deposition prevention member and the first stage deposition prevention member,
an inert gas supply channel configured to supply the inert gas to the first inert gas supply port and the second inert gas supply port is provided in the stage stopper and the film-forming container, and
an inert gas supply portion configured to supply the inert gas to the inert gas supply channel is provided in the film-forming container.

9. The atomic layer deposition apparatus according to claim 2,
wherein the stage stopper includes
a third inert gas supply port configured to supply inert gas to a third inert gas supply channel formed by a gap between the second stage stopper deposition prevention member and the upper surface of the stage stopper.

10. The atomic layer deposition apparatus according to claim 8,
wherein a plurality of the first inert gas supply ports are formed along an entire periphery of a vicinity of the upper surface of the stage stopper, or the first inert gas supply port is continuously formed along the entire periphery of the vicinity of the upper surface of the stage stopper.

11. The atomic layer deposition apparatus according to claim 8,
wherein a plurality of the second inert gas supply ports are formed along an entire periphery of the substrate-side side surface of the stage stopper, or the second inert gas supply port is continuously formed along the entire periphery of the substrate-side side surface of the stage stopper.

12. The atomic layer deposition apparatus according to claim 9,
wherein a plurality of the third inert gas supply ports are formed along an entire periphery of the upper surface of the stage stopper, or the third inert gas supply port is continuously formed along the entire periphery of the upper surface of the stage stopper.

13. The atomic layer deposition apparatus according to claim 1, further comprising:
an injector provided with a first opening and being provided on an outer wall of the film-forming container such that positions of a gas inlet side opening of the film-forming container and the first opening are aligned;
an injector deposition prevention member inserted and attached to the gas inlet side opening so as to be in the film-forming container at a position more inward than the injector;
an outlet flange provided with a second opening and being provided on the outer wall of the film-forming container such that positions of a gas outlet side opening of the film-forming container and the second opening are aligned; and
an outlet deposition prevention member inserted and attached to the gas outlet side opening so as to be in the film-forming container at a position more inward than the outlet flange,
wherein each of the injector deposition prevention member and the outlet deposition prevention member includes a flange in the film-forming container, the flange being larger than the gas inlet side opening and the gas outlet side opening.

14. The atomic layer deposition apparatus according to claim 13,
wherein the first stage stopper deposition prevention member has one or a plurality of deposition prevention member openings that allow the injector deposition prevention member and the outlet deposition prevention member to be inserted and attached thereto, and
the flange is larger than the deposition prevention member opening.

15. The atomic layer deposition apparatus according to claim 1, further comprising:
a plate electrode provided so as to face the vertically movable stage;
an insulating support provided on a side of the plate electrode and being configured to support the plate electrode; and
an insulating deposition prevention member provided on a peripheral portion of a top-plate supporting portion configured to hold the insulating support, and covering the top-plate supporting portion and the insulating support.

16. An atomic layer deposition method comprising the steps of:
(a) mounting a substrate on a stage provided in a film-forming container;
(b) after the step (a), introducing source gas from a gas inlet provided in the film-forming container into the film-forming container such that the source gas is absorbed onto the substrate;
(c) after the step (b), introducing purge gas from the gas inlet into the film-forming container such that the source gas is discharged outside the film-forming container;
(d) after the step (c), introducing reaction gas from the gas inlet into the film-forming container such that the reaction gas is supplied onto the substrate and a desired thin film is formed over a surface of the substrate; and
(e) after the step (d), introducing purge gas from the gas inlet into the film-forming container such that the reaction gas is discharged outside the film-forming container,
wherein, during the steps (b) to (e), inert gas is flowed in the film-forming container along a stage deposition prevention member covering a side portion and a peripheral portion of the stage.

17. The atomic layer deposition method according to claim 16,
wherein a stage stopper deposition prevention member is arranged on a stage stopper configured to stop rising of the stage, and the inert gas is supplied to a gap between the stage stopper deposition prevention member and an inner wall of the film-forming container via a first inert gas supply channel branched from an inert gas supply channel formed in the stage stopper.

18. The atomic layer deposition method according to claim 17,
wherein the inert gas is supplied to a side portion of the stage via a second inert gas supply channel in the inert gas supply channel.

19. The atomic layer deposition method according to claim 18,
wherein the inert gas is supplied to a gap between the stage stopper deposition prevention member and the stage stopper via a third inert gas supply channel branched from the inert gas supply channel.

* * * * *